(12) United States Patent
Ramsdale et al.

(10) Patent No.: US 7,608,476 B2
(45) Date of Patent: Oct. 27, 2009

(54) ELECTRONIC DEVICE

(75) Inventors: Catherine Mary Ramsdale, Cambridge (GB); Henning Sirringhaus, Cambridge (GB); Timothy Allan Von Werne, London (GB)

(73) Assignee: Plastic Logic Limited, Cambridge (GB)

( * ) Notice: Subject to any disclaimer, the term of this patent is extended or adjusted under 35 U.S.C. 154(b) by 0 days.

(21) Appl. No.: 11/596,211

(22) PCT Filed: May 16, 2005

(86) PCT No.: PCT/GB2005/001928

§ 371 (c)(1),
(2), (4) Date: Nov. 14, 2006

(87) PCT Pub. No.: WO2005/112146

PCT Pub. Date: Nov. 24, 2005

(65) Prior Publication Data

US 2007/0232035 A1    Oct. 4, 2007

(30) Foreign Application Priority Data

May 14, 2004  (GB) ................................. 0410921.1

(51) Int. Cl.
*H01L 21/44* (2006.01)
(52) U.S. Cl. .......................... 438/99; 438/151; 438/158; 438/197; 438/199; 438/478; 257/E21.041; 257/E21.174; 257/E21.567; 257/E21.575; 257/E51.005; 257/E51.017; 257/E51.046
(58) Field of Classification Search ............... 438/99, 438/149, 151, 158, 197, 199, 478; 257/E21.614, 257/E25.021, E27.026, E27.111, E29.273, 257/E29.275, 21.041, 127, 174, 567, 575, 257/E51.005, 17, 46
See application file for complete search history.

(56) References Cited

U.S. PATENT DOCUMENTS

| | | | | |
|---|---|---|---|---|
| 5,305,126 A | * | 4/1994 | Kobayashi et al. | ............ 349/94 |
| 5,587,819 A | * | 12/1996 | Sunohara et al. | ............ 349/106 |
| 6,284,562 B1 | * | 9/2001 | Batlogg et al. | ................ 438/99 |
| 6,424,020 B1 | * | 7/2002 | Vu et al. | ..................... 257/507 |
| 6,555,411 B1 | * | 4/2003 | Bao et al. | ..................... 438/99 |
| 6,596,569 B1 | * | 7/2003 | Bao et al. | ................... 438/151 |
| 6,621,099 B2 | * | 9/2003 | Ong et al. | ..................... 257/40 |
| 6,627,953 B1 | * | 9/2003 | Vu et al. | ..................... 257/347 |
| 6,723,394 B1 | * | 4/2004 | Sirringhaus et al. | .......... 428/1.1 |

(Continued)

FOREIGN PATENT DOCUMENTS

WO    WO 03/056641 A    7/2003

(Continued)

OTHER PUBLICATIONS

Michael L. Chabinyc et al., "Organic polymeric thin-film transistors fabricated by selective dewetting" Applied Physics Letters, American Institute of Physics, Nov. 25, 2002, p. 4260-4262, vol. 81, No. 22, New York, US.

(Continued)

*Primary Examiner*—Michael S Lebentritt
(74) *Attorney, Agent, or Firm*—Sughrue Mion, PLLC (57) ABSTRACT

A technique for high-resolution surface energy assisted patterning of semiconductor active layer islands on top of an array of predefined source-drain electrodes without requiring an additional process step for surface energy patterning.

33 Claims, 5 Drawing Sheets

U.S. PATENT DOCUMENTS

| | | | |
|---|---|---|---|
| 6,770,904 B2 * | 8/2004 | Ong et al. | 257/40 |
| 6,885,024 B2 * | 4/2005 | Bao et al. | 257/40 |
| 7,105,854 B2 * | 9/2006 | Sirringhaus et al. | 257/40 |
| 7,244,669 B2 * | 7/2007 | Sirringhaus et al. | 438/535 |
| 7,300,861 B2 * | 11/2007 | Arias | 438/597 |
| 7,351,606 B2 * | 4/2008 | Arias | 438/99 |
| 7,407,849 B2 * | 8/2008 | Sirringhaus et al. | 438/197 |
| 2003/0059975 A1 * | 3/2003 | Sirringhaus et al. | 438/99 |
| 2004/0029382 A1 | 2/2004 | Kawase | |
| 2006/0275959 A1 * | 12/2006 | Huang et al. | 438/149 |

FOREIGN PATENT DOCUMENTS

| | | |
|---|---|---|
| WO | WO 2004/066477 A | 8/2004 |

OTHER PUBLICATIONS

S. E. Burns et al., "Printing of Polymer thin-film transistors for active-matrix display applications", Journal of the Society for Information Display, Society for Information Display, 2003, p. 599-604, vol. 11, No. 4, San Jose, US.

* cited by examiner

ELECTRONIC DEVICE

This invention relates to a method of forming an electronic device involving the deposition of a liquid containing a semiconductive material or a precursor thereto to form a semiconductive channel.

One example of an electronic device obtainable by such a method is a semiconducting conjugated polymer thin-film transistor (TFTs). Such TFTs have recently become of interest for applications in cheap logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). Charge carrier mobilities up to 0.1 $cm^2/Vs$ and ON-OFF current ratios of $10^6$-$10^8$ have been reached, which is comparable to the performance of amorphous silicon TFTs (H. Sirringhaus, et al., Advances in Solid State Physics 39, 101 (1999)).

Manufacturing of polymer TFTs can be achieved by solution processing and direct-write printing. Graphic arts printing techniques such as inkjet printing, offset, flexographic or screen printing can be used to pattern conductive, semiconductive and dielectric polymer inks, or in fact other solution-processible electronic materials such as printable inorganic metals or inorganic semiconductive nanoparticles or precursor solutions. One of the key requirements for printing-based electronic manufacturing is to achieve a high resolution for definition of critical features and linewidths of a few microns, or few 10's of microns at most. However, straightforward adoption of graphic arts printing techniques for electronic device manufacturing is challenging because of the resolution limitations of these techniques.

For many applications the active semiconducting layer needs to be patterned into an active layer island. This is necessary in order to reduce electrical crosstalk and eliminate parasitic leakage currents between neighbouring devices. Even if the semiconducting material is not doped, leakage currents through the semiconducting layer can be significant, in particular for circuits with a high packing density of transistors, such as high resolution active matrix displays. In an active matrix display metallic interconnects for pixel addressing are running across the display. If semiconducting material is present underneath such interconnects lines, parasitic TFT channels can form underneath these interconnect lines, giving rise to non-negligible leakage currents between pixels.

Straight inkjet printing of semiconducting polymer inks onto wetting substrates results in semiconducting active layer islands with a diameter on the order of 60-150 µm using standard inkjet heads with a droplet volume. It is difficult to further reduce this both because of the limitations in droplet volume achievable with standard graphic art printheads, and because of the relatively low surface tension of many semiconducting polymer inks which promotes spreading of the droplets on the substrate surface. Inks for semiconducting material, such as conjugated polymer semiconductors, are often formulated in highly non-polar solvents, such as xylene or mesitylene. These solvents have low surface tensions, hence on wetting substrates droplets of such non-polar ink formulations spread to a large diameter, typically 50-200 µm for inkjet droplet volumes of 10-50 pl. In many situations, the diameter of a dried non-polar semiconducting droplet is significantly larger than the corresponding diameter of conducting ink droplets deposited from polar, high surface tensions liquids.

Patterning of a semiconductor active layer island can be achieved by patterning of the surface of the substrate into lipophilic and lipophobic surface regions prior to the deposition of the semiconducting ink (Kagan et al., Appl. Phys. Lett. 79, 3536 (2001)). This can be achieved by microcontact printing of a patterned self-assembled monolayer onto a substrate which already contains source-drain electrodes that were predefined by photolithography. The semiconducting material is deposited by dip-coating and confined to the lipophilic regions of the substrate.

One of the disadvantages of the process disclosed by Kagan et al. is that the definition of the surface energy pattern requires an additional patterning step of a surface modification layer (i.e. the formation of the patterned self-assembled monolayer for microcontact printing) which increases the complexity and cost of the manufacturing process.

It is an aim of the present invention to provide an improved method for forming an electronic device.

According to the present invention, method(s) and device(s) are provided as set out in the accompanying independent claims. Preferred features are set out in the dependent claims.

As specified in claim 1, the method according to the present invention involves using spaced apart bodies of electrically conductive material that later form part of the finished electronic device to control the deposition of a liquid containing a semiconductive material or a precursor thereto to form in the finished electronic device a semiconductive channel connecting the two spaced apart bodies of electrically conductive material. In one embodiment, the spaced apart bodies are used to directly control the deposition of said liquid by virtue of their relative surface wetting properties (i.e. relative attraction or repellence for said liquid compared to the substrate on which they are formed). In another embodiment, the spaced apart bodies are used to indirectly control the deposition of said liquid; the spaced apart bodies are used to control a surface modification process to define a surface energy pattern on the substrate, which surface energy pattern is then used to control the deposition of said liquid.

According to one embodiment of the invention, self-aligned confinement of the semiconducting channel (active layer island) to the source-drain electrodes is achieved by depositing a low-surface energy layer onto the substrate prepared prior to deposition and patterning of the source and drain electrodes.

According to another embodiment of the invention, self-aligned confinement of the semiconducting channel (active layer island) to the source-drain electrodes is achieved with a surface modification step that is performed after deposition and patterning of the source-drain electrode and has a different effect on the surface energy of the source/drain electrodes than on the surface energy of the non-metallised regions of the substrate.

In both these embodiments the semiconducting ink is attracted onto the source and drain electrodes and covers them at least partially, but is repelled by the non-metallized substrate regions surrounding the source/drain electrodes. Various techniques such as adjusting the ink formulation, the substrate wetting conditions, the shape of the source-drain electrodes, and the deposition conditions can be used to prevent the semiconducting ink from dewetting off the narrow channel region between the source and drain electrodes.

Embodiments of the present invention will now be described in more detail, by way of example only, with reference to the accompanying drawings, in which:

FIGS. 1 (A) and (B) show the use of a substrate surface layer for generation of a surface energy pattern defined by a source-drain electrode pattern for the deposition of a semiconducting active layer island according to a first embodiment of the present invention;

FIGS. 3 (A) and (B) show the use of a selective surface modification step of a source-drain electrode surface for generation of a surface energy pattern defined by a source-drain electrode pattern for the deposition of a semiconducting active layer island according to a third embodiment of the present invention;

FIGS. 4(A) and (B) show an example of a design for a source-drain electrode pattern including non-electrically active wetting regions in the vicinity of the channel region for preventing dewetting of the semiconducting ink off the channel region; and FIGS. 5 (A-C) show how the semiconducting active layer may vary in thickness over the dimension of the device.

According to the first embodiment of the present invention, a modified polymer layer of low surface energy is formed over the substrate. The source and drain electrodes are then deposited on the modified surface and are of a higher surface energy than the polymer layer, resulting in the semiconductor material having a higher affinity for the source/drain contacts than for the modified substrate surface.

Figure 1:
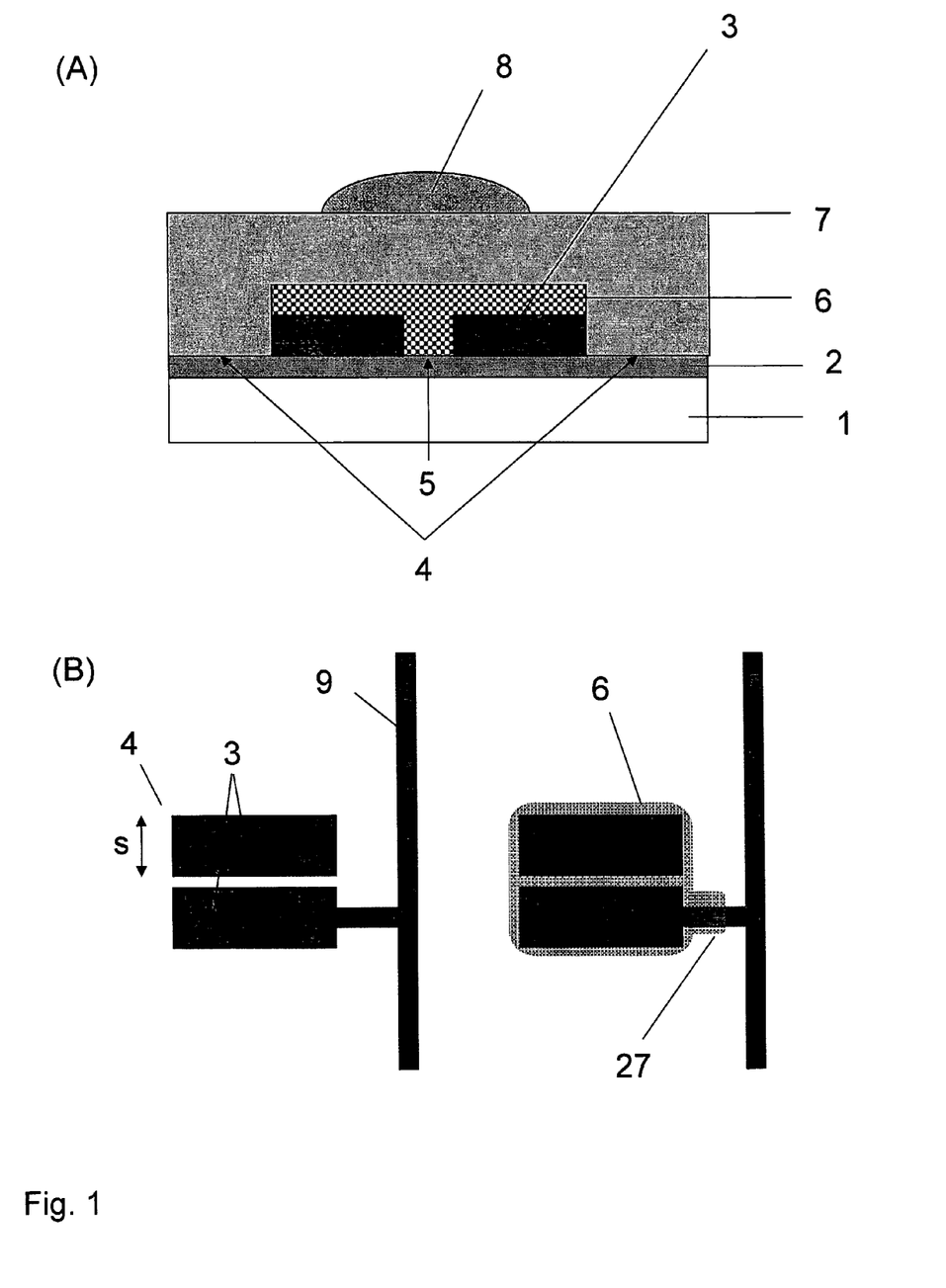

With reference to FIG. 1, onto the substrate 1 a low surface energy, oleophobic layer 2 is formed. The surface tension of layer 2 is preferably less than 45 dyn/cm, more preferably less than 35 dyn/cm, most preferably less than 25 dyn/cm. The substrate maybe a rigid substrate such as a glass substrate or a flexible substrate, such as a PET or PEN.

Layer 2 maybe a layer of polymer with a low surface energy, such as a layer of benzocyclobutene (BCB), or a fluorinated or semifluorinated polymer. Layer 2 may be made insoluble for subsequent processing steps by subjecting the polymer layer to a cross-linking chemical reaction upon exposure to either U.V or I.R radiation or upon thermal annealing. Layer 2 may also act as a planarization layer to reduce the roughness of the substrate. Layer 2 may also be a low-surface energy self-assembled monolayer, such as an alkylated or fluorinated chlorosilane capable of bonding to functional groups on the surface of the substrate. For example, layer 2 might be a spin-on-glass layer modified by a self-assembled monolayer such as a layer of an alkylchlorosilane, alkylmethoxysilane, hexamethyldisilazane, or a fluoroalkylchloro- or fluoroalkylmethoxysilane. Alternatively, the substrate itself might be chosen such as to have a surface tension less than 45 dyn/cm, more preferably less than 30 dyn/cm, most preferably less than 25 dyn/cm. In this case no special surface layer is required.

Subsequently the source and drain electrodes 3 are patterned. The patterning of the conducting source-drain electrodes can be achieved by a range of different techniques including, but not limited to, inkjet printing, soft lithographic printing (J. A. Rogers et al., Appl. Phys. Lett. 75, 1010 (1999); S. Brittain et al., Physics World May 1998, p. 31). Preferably, the electrodes are patterned by metal deposition followed by photolithographic patterning or by direct laser ablation. The source-drain electrodes maybe formed from a conducting polymer, a printable metal or a vaccum evaporated or sputtered metal, preferably gold (Au), but it may also be silver (Ag), platinum (Pt), Palladium (Pd) or other high work function metals. An adhesion layer, such as a layer of chromium or titanium, or a short plasma exposure prior to metal deposition might be used to improve the adhesion of the source-drain electrodes to the substrate. The patterning step defines the source-drain electrodes separated from each other by a narrow channel 5, and surrounded by substrate region 4, in both of which the surface of the low surface energy layer 2 is exposed. Clean metal surfaces tend to have high surface tensions on the order of 1000 dyn/cm. The difference between the surface energy of the low surface tension polymer 2 and the metal source-drain electrodes, therefore provides a strong confinement force for the subsequent deposition of the semiconducting polymer ink.

Subsequently, a solution of an active semiconducting material 6 is deposited from solution over the electrodes and channel region. As the electrodes have a higher surface energy than the substrate layer 2, the semiconductor solvent is attracted by these differences in the surface energies to cover the source/drain regions, and as discussed below the ink formulation, deposition conditions and surface conditions are arranged such that the semiconductor is repelled by region 4, but does not dewet from the channel region 5. For the deposition of the semiconducting material a broad range of printing techniques may also be used including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. However, a preferred technique is drop-on-demand inkjet printing.

The surface tension of the semiconducting ink is preferably higher than 25 dyn/cm, more preferably higher than 28 dyn/cm, most preferably higher than 30 dyn/cm. The contact angle of the semiconducting ink on the surface of the substrate layer 2 is preferably higher than 20°, more preferably higher than 30°, most preferably higher than 50°. For most metal electrodes with clean surfaces the contact angle of the semiconducting ink on the surface of the metal electrodes is close to 0° due to the high surface tensions of most clean metal surfaces.

Preferably, the semiconductor ink exhibits a contact angle with the surface of the substrate that is more than 20 degrees higher than with the surface of the source-drain electrodes. More preferably, the semiconductor ink exhibits a contact angle with the surface of the substrate that is more than 30 degrees higher than the contact angle with surface of the source-drain electrodes. Most preferably, the semiconductor ink exhibits a contact angle with the surface of the substrate that is more than 50 degrees higher than with the surface of the source-drain electrodes.

The ink formulation and the surface wetting conditions prior to deposition of the semiconducting ink are chosen such that:

a) The solution of the semiconducting material is attracted by the surface of the source and drain electrodes 3, and has a low affinity for and is repelled by the low surface energy region 4. After drying of the solvent the semiconducting layer covers the source-drain electrodes, but is repelled by the surrounding regions 4 in such a way that the semiconducting active layer island 6 adopts a shape similar to that of the source and drain electrodes (see FIG. 1B). Preferrably, the semiconducting layer 6 extends into region 4 by less than 30 microns beyond the edge of the source and drain electrodes, more preferably by less than 15 microns, most preferably by less than 5 microns.

b) In spite of the low surface energy of the substrate in region 5 the solution of the semiconducting material does not dewet from the low energy surface region 5, and after drying of the solvent forms an essentially continuous film over the channel region 5, that is also in contact with the source and drain electrodes.

One or both of the source or drain electrodes may be connected to an interconnect 9 made from the same or a different conducting material than the source-drain electrodes. When a local deposition technique such as inkjet printing is used to deposit the semiconducting ink locally on top of the source-drain electrodes, the ink of the semiconducting material will tend to spread onto the interconnect regions 27 (see FIG. 1B), but if the width of the interconnect is chosen sufficiently narrow, i.e. preferably less than 15 microns, more preferably less than 10 microns, the semiconducting material will not spread significantly away from the source-drain electrodes along the interconnect lines.

According to a second embodiment of the invention the self-aligned confinement of the semiconducting active layer island to the source-drain electrode region is achieved by performing a surface modification step on the substrate after defining of the source-drain electrodes, and prior to solution deposition of the semiconducting layer. The surface modification step is chosen such that it has a different effect on the surface of the source/drain electrodes than on the surface energy of the non-metallised regions of the substrate without requiring a separate patterning step.

Figure 2:
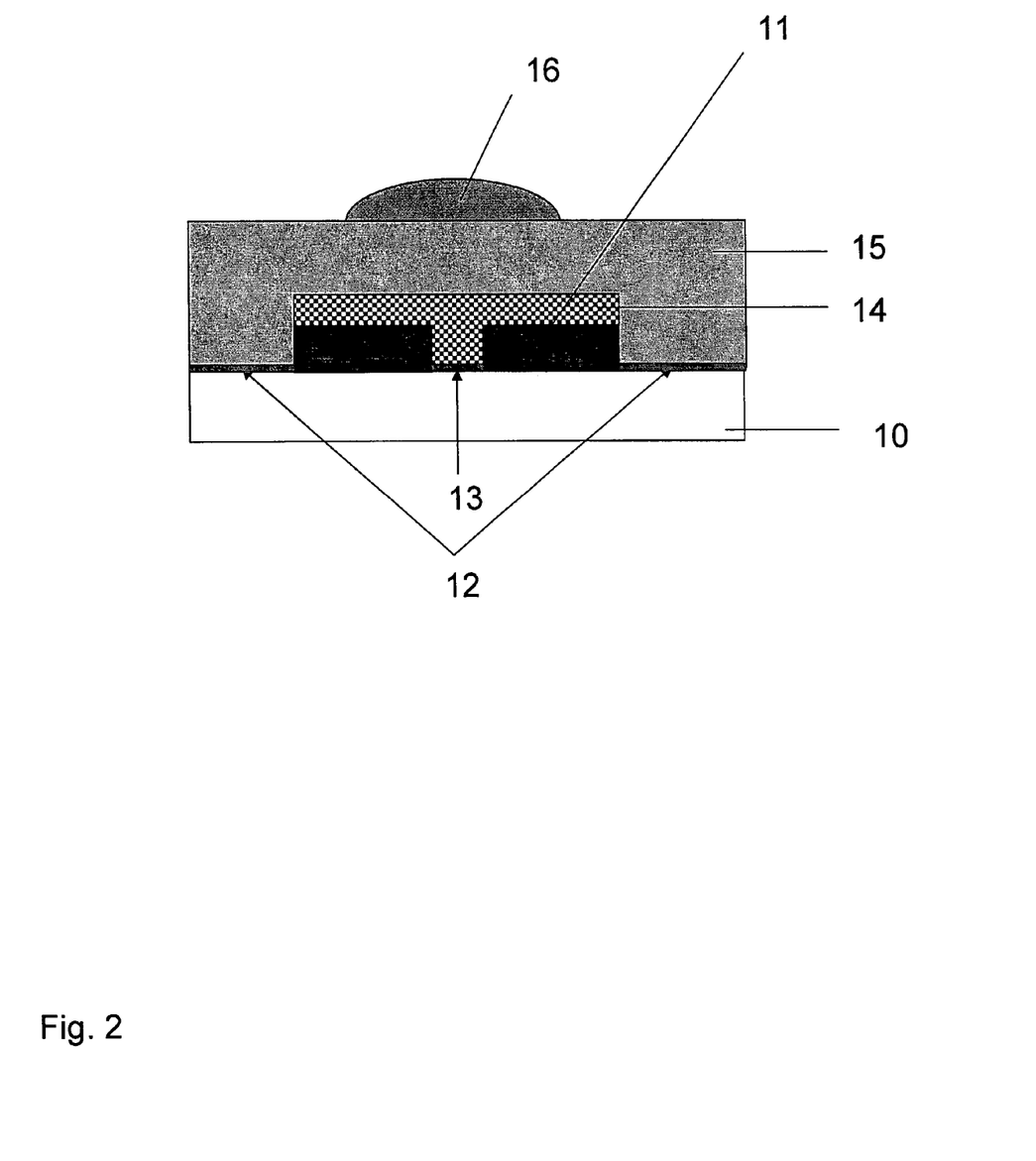
FIG. 2 shows the use of a selective surface modification step of non-metallized regions of a substrate for generation of a surface energy pattern defined by a source-drain electrode pattern for the deposition of a semiconducting active layer island according to a second embodiment of the present invention.

The source and drain electrodes are then deposited onto the substrate (see FIG. 2). The patterning of the conducting source-drain electrodes can be achieved by a range of different techniques including, but not limited to, inkjet printing, soft lithographic printing (J. A. Rogers et al., Appl. Phys. Lett. 75, 1010 (1999); S. Brittain et al., Physics World May 1998, p. 31). Preferably, the electrodes are patterned by metal deposition followed by photolithographic patterning or direct laser ablation. The source-drain electrodes maybe formed from a conducting polymer, a printable metal or a vaccum evaporated or sputtered metal, preferably gold (Au), but also be silver (Ag), platinum (Pt), Palladium (Pd) or other high work function metals. An adhesion layer, such as a layer of chromium or titanium, or a short plasma exposure might be used to improve the adhesion of the source-drain electrodes to the substrate. The patterning step defines the source-drain electrodes separated from each other by a narrow channel 13, and surrounded by substrate region 12, in both of which the surface of the substrate is exposed.

The surface modification step lowers the surface energy of the substrate in regions 12 and 13 relative to that of the surface of the source-drain electrodes 11. The surface modification step is selective in the sense that it primarily modifies either the electrodes, or the exposed surface of the substrate in the areas not covered by the electrodes. Examples of such surface modification steps are plasma treatment steps, such as a $CF_4$ plasma treatment step, or deposition of a self-assembling monolayer (SAM) compound, such as, but not limited to, an alkylchlorosilane, alkylmethoxysilane, hexamethyldisilazane, or a fluoroalkylchloro- or fluoroalkylmethoxysilane SAM.

After the patterning of the conductive contacts, such as the preferred gold source and drain electrodes as described above, the substrate may be deposited within a bath of OTS (octadecyltrichlorosilane) and Toluene at a ratio 1:40 and a temperature of 80° for approximately 10 minutes. This process deposits a layer of OTS on the surface of the substrate, therefore modifying the surface energy of the substrate and providing a contrast of surface energy between the substrate surface and the surface of the contacts. The substrate may then be rinsed in IPA (isopropanol) and dried in a stream of nitrogen. The resultant substrate surface will provide an significantly increased contact angle with water.

After the surface treatment the surface tension of the substrate in the non-metallised regions is preferably less than 45 dyn/cm, more preferably less than 35 dyn/cm, most preferably less than 25 dyn/cm.

Subsequently, a solution of an active semiconducting material 14 is deposited from solution over the electrodes and channel region. As the electrodes have a higher surface energy than the modified, exposed substrate surface, the semiconductor solvent is attracted by these differences in the surface energies to cover the source/drain regions. Deposition conditions and surface conditions are arranged such that the semiconducting ink is repelled by region 12, but does not dewet from the channel region 13. For the deposition of the semiconducting material a broad range of printing techniques may also be used including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. However, a preferred technique is drop-on-demand inkjet printing.

The surface tension of the semiconducting ink is preferably higher than 25 dyn/cm, more preferably higher than 28 dyn/cm, most preferably higher than 30 dyn/cm. The contact angle of the semiconducting ink on the surface of the surface modified substrate is preferably higher than 20°, more preferably higher than 30°, most preferably higher than 50°. For most metal electrodes with clean surfaces the contact angle of the semiconducting ink on the surface of the metal electrodes is close to 0° due to the high surface tensions of most clean metal surfaces.

Preferably, the semiconductor ink exhibits a contact angle with the surface of the non-metallized substrate regions that is more than 20 degrees higher than with the surface of the source-drain electrodes. More preferably, the semiconductor ink exhibits a contact angle with the surface of the non-metallized substrate regions that is more than 30 degrees higher than with the surface of the source-drain electrodes. Most preferably, the semiconductor ink exhibits a contact angle with the surface of the non-metallized substrate regions that is more than 50 degrees higher than that on the surface of the source-drain electrodes.

According to one example, a layer of spin-on-glass (SOG) is deposited on top of a flexible plastic substrate such as PET and cured by either thermal annealing or UV curing. The source and drain electrodes that may consist of gold, are then defined by photolithography. An adhesion layer of a metal such as titanium or of a self-assembled monolayer with one functional group bonding to the SOG substrate, and another functional group bonding to the gold electrode may be used to improve the adhesion of the gold electrodes to the substrate. An example of a self-assembled monolayer to improve the adhesion of gold on SOG is mercapto-propyl-trimethoxsilane. The adhesion layer is patterned together with the gold electrode either by etching or by lift-off patterning. After the source-drain patterning the substrate surface is cleaned by solvent cleaning and/or oxygen plasma cleaning in order to expose a large number of polar, reactive hydroxyl functional groups on the surface of the SOG. The substrate is then exposed to a self-assembled monolayer which bonds selectively to the hydroxyl groups on the SOG surface, but not to the surface of the gold electrode. This selective surface modification does not required an additional patterning step. Preferably, the SAM is chosen such that it renders the surface of the SOG more hydrophobic, most preferably the SAM renders the surface of the SOG oleophobic without modifying the surface of the gold electrodes. Examples of such SAMs are alkylchlorosilanes, alkylmethoxysilanes, hexamethyldisilazane, or fluoroalkylchloro- or fluoroalkylmethoxysilanes.

Subsequently, the ink of the semiconducting material is deposited. Preferably, after the SAM treatment the contact angle of the semiconducting ink on the SAM modified surface of the SOG is more than 20° higher than with the surface of the source-drain electrodes. More preferably the contact angle of the semiconducting ink on the SAM modified surface of the SOG is higher by more than 30° than that on the surface of the source-drain electrodes. Most preferably, the contact angle of the semiconducting ink on the SAM modified surface of the SOG is more than 50° higher than with the surface of the source-drain electrodes.

An ink of the semiconducting polymer, such as poly(dioctylfluorene-co-bithiophene) formulated in a 0.25% solution by weight in m-xylene or a 0.25% solution by weight of a 3:1 mixture of m-xylene and cyclohexylbenzene may then be inkjet printed. The thickness of the semiconductor layer may be controlled by altering the concentration of the semiconducting polymer ink. This may then require altering the relative ratios of the solvents in the solvent mixture ink in order to achieve the required isolation. The pure xylene ink dries more quickly than the solvent mixture ink, but the solvent mixture ink has a higher viscosity than the pure xylene ink. The ink is repelled from region 12, but it does not dewet on top of region 13. After deposition the semiconducting ink is dried in a vacuum oven for 3 hours. Then a 700-1300 nm thick film of polymethylmethacrylate (PMMA) in butylacetate is deposited by spin coating at a speed of 2000 rpm. The surface of the PMMA is then made wetting by a short $O_2$ plasma exposure (50 W, 30 s), and a gate electrode of PEDOT/PSS is inkjet printed on top.

According to a second example, the substrate surface comprises a polymer layer, such as a layer of polyimide, onto which source-drain electrodes of gold or palladium are defined by photolithography. Subsequently, the substrate is exposed to a $CF_4$ plasma treatment step (500 W, 2 min) which fluorinates the surface of the polymer layer in the non-metallized regions of the substrate, i.e. lowers the surface energy, without decreasing significantly the surface energy in the region of the metal electrodes.

The semiconducting polymer ink may again be a polymer such as poly(dioctylfluorene-co-bithiophene) formulated in a 0.25% solution by weight in m-xylene or a 0.25% solution by weight of a 3:1 mixture of m-xylene and cyclohexylbenzene may then be inkjet printed. The pure xylene ink dries more quickly than the solvent mixture ink, but the solvent mixture ink has a higher viscosity than the pure xylene ink. The ink is repelled from region 12, but it does not dewet on top of region 13. After deposition the semiconducting ink is dried in a vacuum oven for 3 hours. Then a 700-1300 nm thick film of polymethylmethacrylate (PMMA) in butylacetate is deposited by spin coating at a speed of 2000 rpm. The surface of the PMMA is then made wetting by a short $O_2$ plasma exposure (50 W, 30 s), and a gate electrode of PEDOT/PSS is inkjet printed on top.

To further increase the surface energy contrast between the non-metallized substrate regions and the source-drain electrodes an additional selective surface modification of the source-drain electrodes to increase the surface energy of the source-drain electrodes might also be performed. This can be achieved by a selective plasma treatment step, or deposition of a SAM with a polar tail group, such as a $NH_3^+$ tail group. The SAM selectively is chosen to selectively bind to the metal surface, but not to the non-metallized substrate surface. In the case of Au, Ag, Pd and other metal electrodes an example of such a selective SAM is a thiol-based SAM. In the case of many conducting polymers a chlorosilane or alkoxy silane based SAM can be used. It should be noted though that in the case of clean metals the surface energy already tends to be rather high, and the present technique will therefore be of particular use for metal surfaces with relatively low surface energy, such as conducting polymers, or printable metal surfaces which contain low surface energy organic contaminants.

The SAM is chosen such that it does not negatively affect the charge injection into the device.

It is a feature of the above-described embodiments that in order to avoid additional patterning steps the dewetting surface of the substrate in the non-metallised regions 4 and 5, 12 and 13, respectively, is essentially the same, i.e. the semiconducting has a tendency to dewet from the channel region 5, 13, respectively. To prevent dewetting of the semiconducting ink from the channel region one or a combination of the following techniques can be used:

Increase surface tension of the semiconductive ink: A high surface tension of the semiconductive ink increases the energy penalty for splitting droplets on top of the channel region, and tends to suppress droplet splitting and dewetting. The surface tension can be increased by using a high surface tension solvent, or a mixture of solvents.

Control of surface tension of substrate: The surface tension of the substrate $\gamma_{sv}$ in regions 4/5, 12/13, 19/20 (assumed here to be of identical surface composition) can be controlled such that $\gamma_{sv}^{min} < \gamma_{sv} < \gamma_{sv}^{max}$, where $\gamma_{sv}^{max}$ is the maximum surface tension that still provides efficient repulsion of the semiconducting material from region 4, 12, 19, respectively. $\gamma_{sv}^{min}$ is the minimum surface tension below which dewetting of the ink occurs on region 5, 13, 20, respectively. The substrate surface tension can be varied, for example, by altering the chemical composition of the substrate, or by exposing the substrate to a chemical or physical surface treatment or electromagnetic radiation, or by controlling the temperature and humidity conditions before and during the deposition.

Increasing viscosity of the semiconducting ink: A high solution viscosity facilitates semiconducting ink confinement by regions 4, 12, 19, respectively, as it reduces the kinetic energy of the contact line of the spreading droplet. A high viscosity also prevents dewetting on top of the channel region, because it reduces the mobility and flow of molecules in solution that is required to split one droplet into several separate isolated droplets. The viscosity can be controlled by judicious choice of solvents, addition of cosolvents, or by increasing the concentration and/or molecular weight of a semiconducting polymer in solution, or by lowering of the solution temperature.

Decreasing drying time: By decreasing the drying time the confinement of the ink by regions 4, 12, 19 can be improved, and the tendency of the semiconducting ink to dewet from region 5, 13, 20 can be decreased. If the solution is formulated in a low boiling point solvent or if the evaporation rate of the solvent is enhanced, for example by depositing the solution onto a heated substrate, exposing the substrate to electromagnetic radiation during deposition and drying, or by depositing under a flow of "dry", inert gas, the drying time is decreased. The viscosity of the solution increases rapidly during drying, and by the time dewetting would occur, the solution viscosity is already so high that dewetting is suppressed.

Reducing droplet volume: By reducing the droplet volume, i.e. increasing the surface to bulk ratio of the droplet, the drying time can be reduced to prevent dewetting of the semiconducting ink from the channel region.

Figure 4:
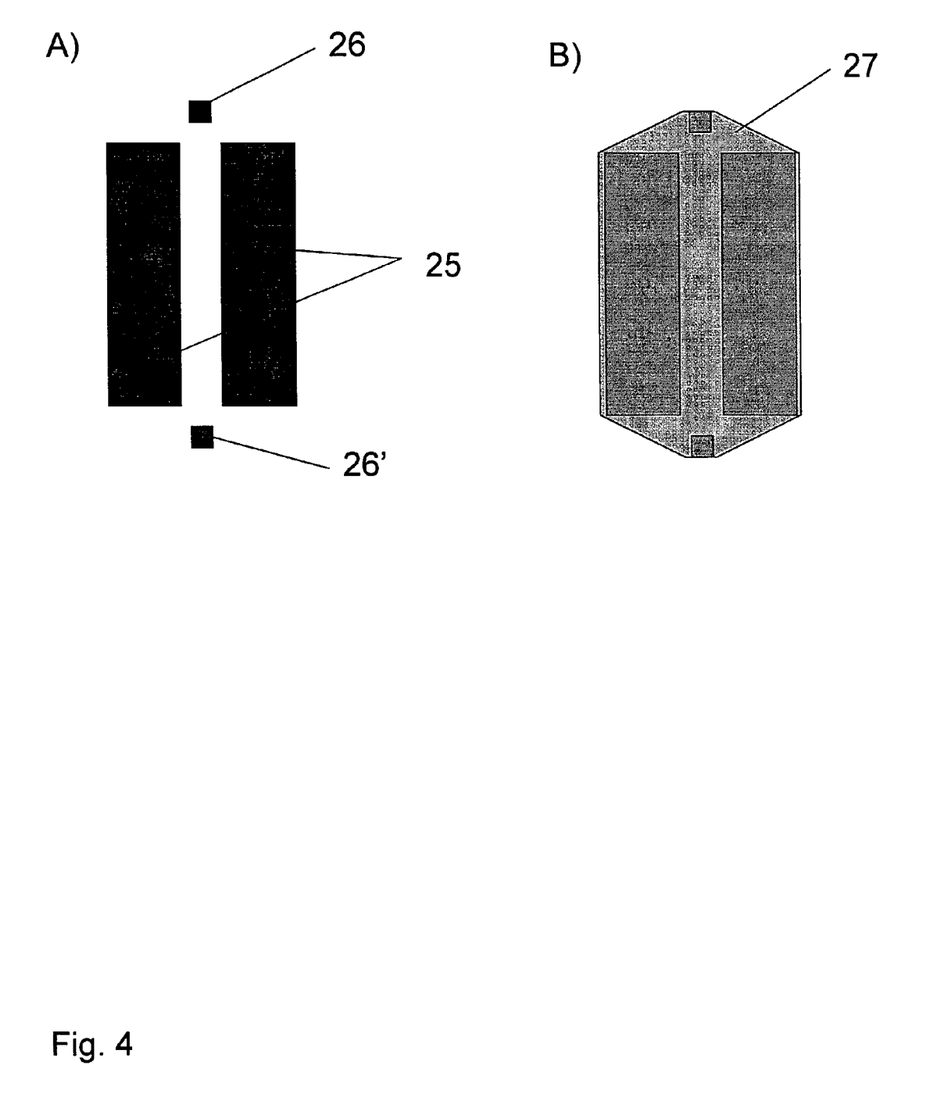

Design of source-drain electrode pattern: The source-drain pattern can be designed in such a way that it incorporates regions of high surface energy in the vicinity of the channel edges to pin the contact line of the semiconducting ink in the vicinity of the channel and prevent it from dewetting off the channel. Once the contact line is pinned, i.e. the semiconducting material starts to dry at the edge of the still liquid droplet, and the tendency of the droplet to dewet is much suppressed. An illustrative example for possible pattern design is shown in FIG. 4. Regions 26 and 26' can be fabricated from the same metal, and patterned in the same step as the source-drain electrodes, however, they are electrically isolated, and spaced away sufficiently far from the source-drain electrodes to prevent electrical shorting between the source and drain electrodes. When the semiconducting ink is deposited regions 26, 26' pin the contact line and prevent the ink from dewetting off the channel.

Figure 3:
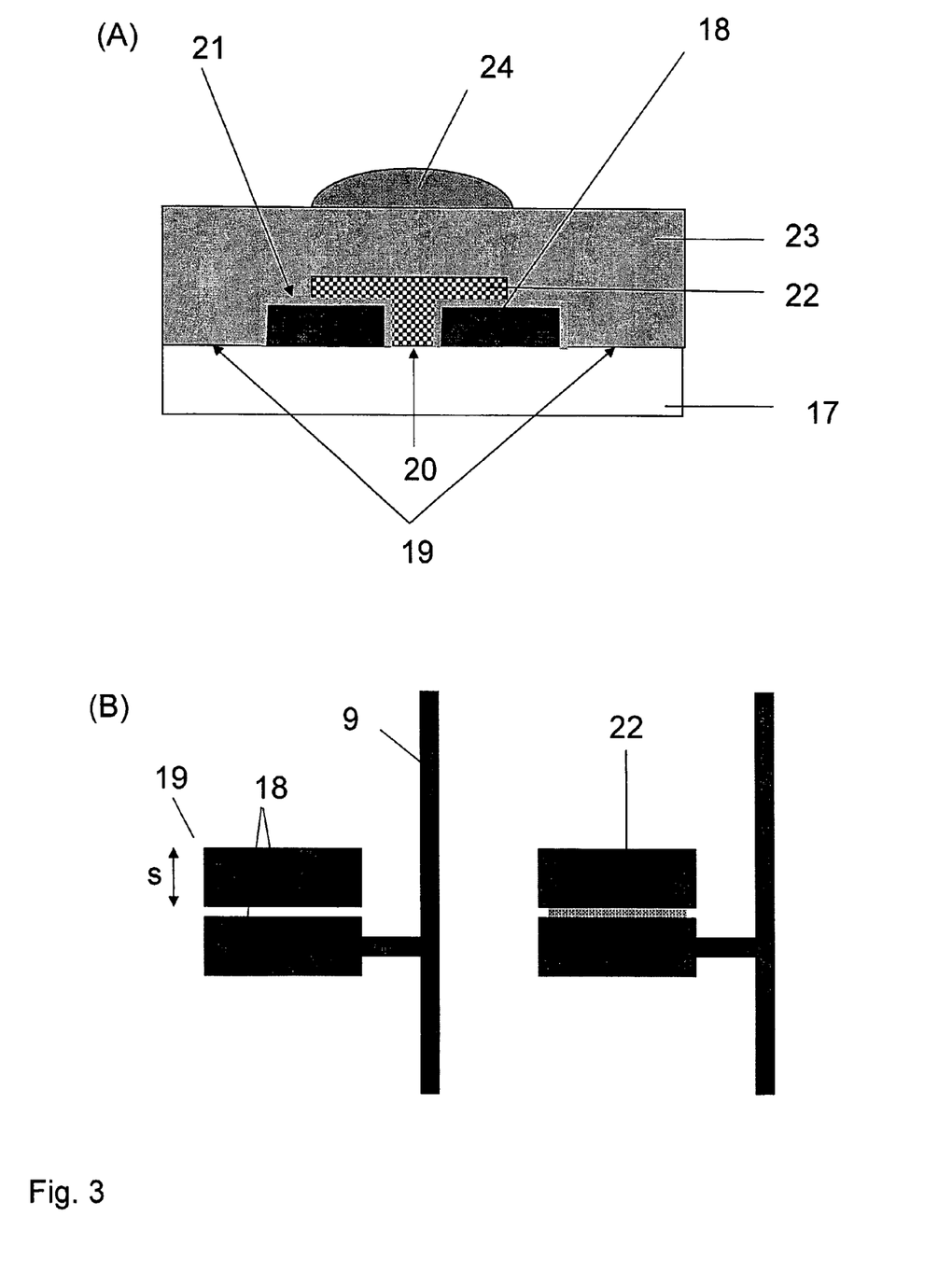

According to a third embodiment of the present invention, a further method is used for directing the positioning of the semiconductor ink (FIG. 3). The method comprises self-aligned modification of the surface of the source and drain electrodes by selective deposition of a self-assembled monolayer 21 onto the surface of the source-drain electrodes without a separate patterning step and followed by local solution deposition of the semiconducting ink. The SAM is chosen such that it does not attach to the surface of the non-metallized regions of the substrate, but lowers the surface energy of the source-drain electrodes with respect to the surface of the non-metallized regions of the substrate. Alternatively, in the case of solution-deposited electrodes a surfactant can be mixed into the ink of the conducting material. Upon drying the surfactant segregates to the surface of the conducting deposit, and forms a self-aligned, low surface energy coating around the surface of the conducting electrodes. Examples of suitable surfactant are given in patent no. WO03056641. Preferably, the surfactant is a fluorinated surfactant.

In this embodiment the surface of the source-drain electrodes is oleophobic for the semiconductive ink, while the non-metallised regions of the substrate are more wetting to the semiconductive ink. The semiconductive ink is then deposited locally over the channel region 20 and on top of the source-drain electrodes 18, without coming into contact with the non-metallized regions 19 of the substrate. A preferred deposition technique for the semiconductive ink is inkjet printing. Upon contact of the ink droplets with the surface, the ink wets the channel region 20, but then is repelled by the oleophobic surface of the source-drain electrodes. Since the channel region is typically less than 20 microns long, the ink is not fully confined by the channel 20. The ink spills over onto the source-drain electrodes 18 by a small distance, but is then repelled by the oleophobic surface before the contact line reaches the non-metallized regions 19 of the substrate (FIG. 3). In this way the semiconductive active layer island partially covers the region of the source-drain electrodes and covers the channel region, but is absent from the region surrounding the device (FIG. 3(B)).

The SAM or surfactant is chosen such that charge injection from the electrode to the semiconductor is not adversely affected. This can be achieved by choosing a SAM or surfactant with a sufficiently short molecular length.

According to one example, a source-drain electrode array of gold is patterned on a flexible PET substrate. The substrate is then exposed to a perfluorinated alkylthiol, which selectively attaches to the gold surface, but not the PET surface. Then the semiconducting polymer poly(dioctylfluorene-co-bithiophene) formulated in a 0.25% solution by weight in m-xylene or a 0.25% solution by weight of a 3:1 mixture of m-xylene and cyclohexylbenzene is inkjet printed. The width s (FIG. 1(A)) of the gold electrode lines and the droplet volume are chosen such that the ink droplets do not come in contact with the bare PET substrate in region 20, but as a result of the oleophobic gold surface dry into a narrow active layer island with a lateral extent of less than 2 s+L (L: channel length), that is significantly smaller than the lateral extent which the droplet would exhibit if printed somewhere inside the non-metallized regions 19 of the substrate. After deposition the semiconducting ink is dried in a vacuum oven for 3 hours. Then a 700-1300 nm thick film of polymethylmethacrylate (PMMA) in butylacetate is deposited by spin coating at a speed of 2000 rpm. The surface of the PMMA is then made wetting by a short $O_2$ plasma exposure (50 W, 30 s), and a gate electrode of PEDOT/PSS is inkjet printed on top.

Figure 5:
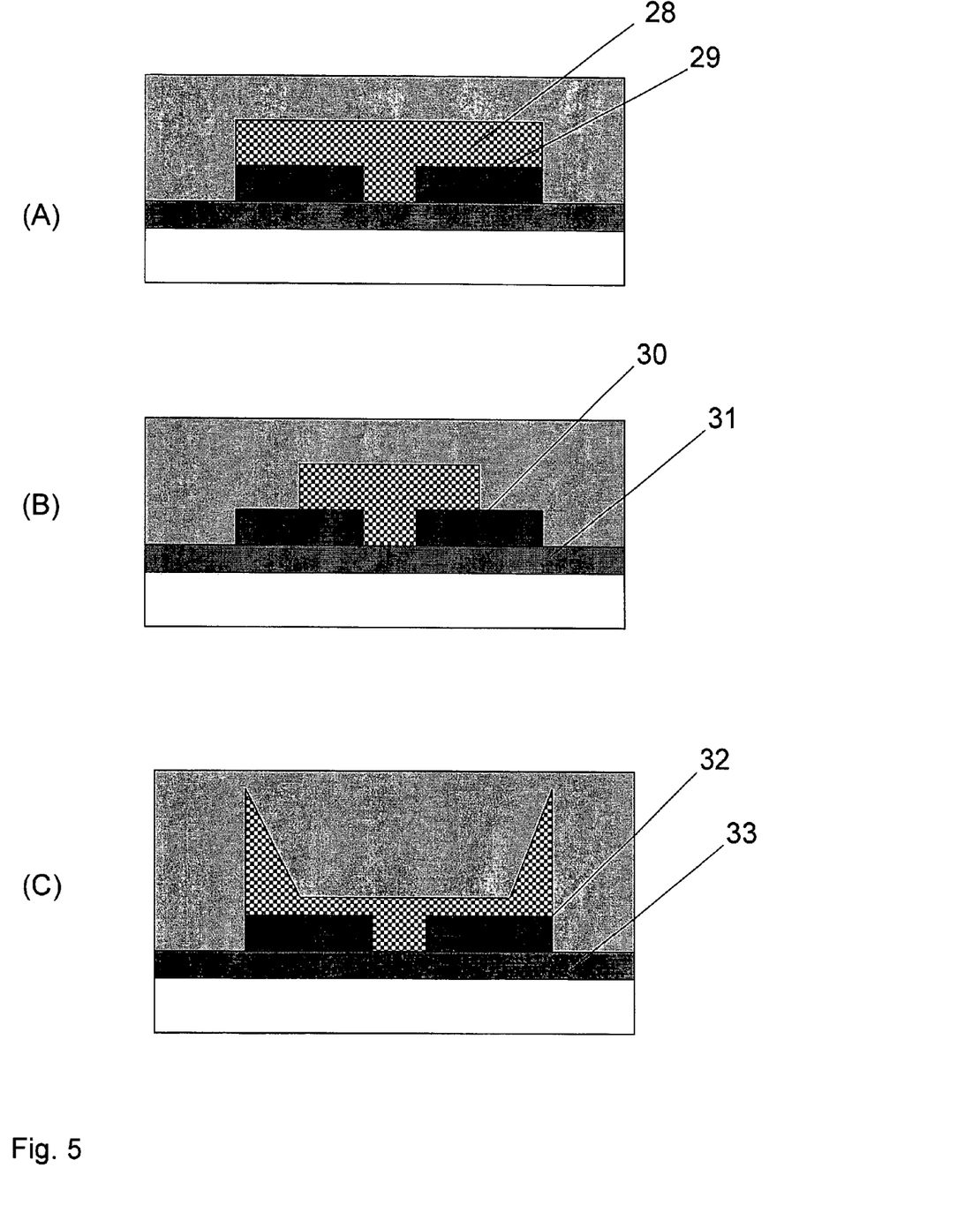

It is desirable that the thickness of the semiconducting active layer island (typically on the order of 10-100 nm) is as homogeneous as possible over the dimension of the device (FIG. 5A). In some cases, after being repelled by the low surface energy region 4, 12, 19, respectively, the semiconducting ink droplet might further recede before drying with a contact line no longer in contact with the boundary between regions 30 and 31 (FIG. 5B). This is not necessarily problematic as long as the film remains sufficiently thin and continuous in the region of the active channel, and remains in contact with both the source and drain electrodes.

However, more commonly in the case of low surface tension inks the ink tends to dry in a "coffee-stain" drying mode, where the contact line becomes pinned, and a flow of liquid and material towards the edge of the droplet is established (FIG. 5C). This flow is driven by the higher rate of liquid evaporation near the edge of the droplet than at its centre. Material is therefore deposited preferentially at the edges of the droplet. In most cases this is undesirable, as it results in very thin and possibly discontinuous films in the active channel region of the device. It also increases the tendency of the droplets to dewet from the very thin central region over the channel.

Coffee-stain drying can be prevented by increasing the viscosity of the solution, reducing the evaporation time, for example by using lower boiling point solvents, deposition at elevated temperature, exposing the substrate to electromagnetic radiation during deposition and drying, or flowing a stream of "dry" inert gas over the substrate during deposition. In this way a highly viscous solution state is reached more quickly, before all the material has flown to the edges of the droplet.

With the above-described techniques, self-aligned active layer islands can be formed by solution-deposition and surface-energy controlled confinement without the need for separate surface energy patterning steps. The semiconductor ink and subsequent materials of active layers can be directed to form over the source/drain and channel regions.

These techniques allow high-resolution surface energy assisted patterning of semiconductor active layer islands on top of an array of predefined source-drain electrodes without requiring an additional process step of patterning a surface modification layer. The techniques involve generating a surface energy pattern defined with the help of the predeposited source-drain electrodes without requiring a separate patterning step to define the surface energy pattern. In one example, the surface wetting conditions of the substrate containing the source and drain electrodes are arranged in such a way that the surface of the source/drain electrodes is more wetting to the semiconducting ink than the non-metallised regions of the substrate.

The processes and devices described herein are not limited to devices fabricated with solution-processed polymers.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nanowires (X. Duan, Nature 425, 274 (2003)).

The source-drain electrodes may be patterned by techniques other than photolithography. Suitable techniques include inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, flexographic printing or other graphic arts printing techniques. Inkjet printing is considered to be particularly suitable for large area patterning with good registration, in particular for flexible plastic substrates.

The semiconducting layer may be deposited by techniques other than inkjet printing, such as soft lithographic printing, screen printing, offset or gravure printing, flexographic printing or other graphic arts printing techniques.

The methods disclosed in this invention are applicable to a broad range of device configurations other than the top-gate transistor configuration. In particular the methods are directly applicable to bottom-gate, bottom-contact device configurations in which the source-drain electrodes are formed on top of the gate dielectric, followed by the deposition of the semiconducting active material. In this case the surface modification steps or the low surface energy layer to produce the self-aligned surface energy pattern for confinement of the semiconducting ink are applied to the surface of the gate dielectric, or form part of the gate dielectric. We note that self-assembled monolayers or low-k dielectrics are compatible with achieving high field-effect mobilities at the active semiconductor-dielectric interface, and therefore the formation of the self-aligned surface energy pattern at the active interface of the transistor does not affect adversely the performance of the device.

Devices such as TFTs fabricated as described above may be part of a more complex circuit or device in which one or more such devices can be integrated with each other and/or with other devices. Examples of applications include logic circuits and active matrix circuitry for a display or a memory device, or a user-defined gate array circuit.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of forming an electronic device including spaced apart bodies of electrically conductive material connected by a channel of semiconductive material, the method including the steps of: forming said spaced apart bodies of electrically conductive material on a substrate; and using said bodies to control the deposition of a liquid including said semiconductive material or a precursor thereto to form said semiconductive channel wherein said electrically conductive bodies are formed by depositing conductive material or a precursor thereto on the substrate, and then removing selected portions of the deposited conductive material or precursor thereto.

2. A method according to claim 1, wherein said semiconductive material is essentially absent from the region of the substrate surrounding said bodies of electrically conductive material except in said channel.

3. A method according to claim 1, using the surface wetting properties of said bodies with respect to those of the bare substrate to confine the deposition of said liquid.

4. A method according to claim 3, wherein the relative attractive properties of the surface of said electrically conductive bodies are used to confine said liquid to a region of said conductive bodies and said channel.

5. A method according to claim 4, wherein the surface of said bodies has a greater attraction for said liquid than the surface of the portion of the substrate in the space between said bodies.

6. A method according to claim 3, wherein the surface of said bodies has a lesser attraction for said liquid than the surface of the portion of the substrate in the space between said bodies.

7. A method as claimed in claim 1, wherein said semiconductive channel is formed across a spacing of less than 50 microns between said bodies.

8. A method as claimed in claim 7, wherein said semiconductive channel is formed across a spacing of less than 20 microns between said bodies.

9. A method according to claim 1, wherein said substrate including said conductive bodies is exposed to a surface modification treatment prior to the deposition of said liquid, which changes the relative wetting properties of the surface of said conductive bodies relative to that of the bare substrate, and defines a surface energy pattern on the substrate, which is then used to control the deposition of said liquid including said semiconductive material or a precursor thereto.

10. A method according to claim 9, wherein said surface modification treatment comprises exposing the substrate and said electrically conductive bodies to a material that reacts selectively with either the substrate or the said electrically conductive bodies or adheres selectively to either the substrate or said electrically conductive bodies.

11. A method according to claim 9, wherein the surface modification process includes exposing the substrate and said bodies to a plasma and/or immersing the substrate and said bodies into a bath of surface modification agent.

12. A method according to claim 9, wherein the surface modification step includes selectively increasing the attraction of the surface of said bodies for said liquid.

13. A method according to claim 9, wherein the surface modification step includes selectively decreasing the attraction of the surface of the substrate for said liquid.

14. A method according to claim 9, wherein the surface modification step includes selectively decreasing the attraction of the surface of said bodies for said liquid.

15. A method according to claim 1, wherein said liquid is substantially confined to an area defined by the outer edges of said bodies.

16. A method as claimed in claim 1, wherein the surface tension of said liquid is higher than 25 dyn/cm.

17. A method as claimed in claim 1, wherein the surface tension of said liquid is higher than 28 dyn/cm.

18. A method as claimed in claim 1, wherein the surface tension of said liquid is higher than 30 dyn/cm.

19. A method as claimed in claim 1, wherein the viscosity of said liquid is higher than 5 cP.

20. A method as claimed in claim 1, wherein the viscosity of said liquid is higher than 10 cP.

21. A method according to claim 1, further including the step of forming on the substrate at least one structure of said electrically conductive material in addition to said spaced apart bodies to assist the deposition of said liquid on the substrate in the space between said two electrically conductive bodies.

22. A method according to claim 21, wherein said liquid is substantially confined to an area defined by the outer edges of said bodies and said further structures.

23. A method according to claim 21, wherein said further structures do not function in the operation of the electronic device.

24. A method according to claim 1, wherein said electrically conductive bodies are formed on the substrate by a patterning step.

25. A method according to claim 1, wherein selected portions of the deposited conductive material are removed using a process of laser ablation.

26. A method according to claim 25, wherein selected portions of the deposited conductive material are removed using a process of photolithography.

27. A method according to claim 1, wherein the substrate includes a gate electrode and an overlying dielectric layer, and said electrically conductive bodies are formed on the overlying dielectric layer to define source and drain electrodes.

28. A method according to claim 1, further including the steps of: forming a dielectric layer on the semiconducting channel and forming a gate electrode on the dielectric layer to thereby define together with said electrically conductive bodies and said semiconductive channel a field-effect transistor.

29. An electronic device produced by a method according to claim 1.

30. An integrated circuit including a plurality of electronic devices according to claim 29.

31. A method of forming an electronic device including spaced apart bodies of electrically conductive material connected by a channel of semiconductive material, the method including the steps of:
  forming said spaced apart bodies of electrically conductive material on a substrate;
  forming on the substrate at least one structure in addition to said spaced apart bodies of said electrically conductive material; and
  using said bodies to control the deposition of a liquid including said semiconductive material or a precursor thereto to form said semiconductive channel;
  wherein said at least one structure facilitates the deposition of said liquid on the substrate in the space between said two electrically conductive spaced-apart bodies.

32. A method according to claim 31, wherein said liquid is substantially confined to an area defined by the outer edges of said bodies and said further structures.

33. A method according to claim 31, wherein said further structures do not function in the operation of the electronic device.

* * * * *